United States Patent [19]
Baumbach et al.

[11] Patent Number: 5,625,199
[45] Date of Patent: Apr. 29, 1997

[54] ARTICLE COMPRISING COMPLEMENTARY CIRCUIT WITH INORGANIC N-CHANNEL AND ORGANIC P-CHANNEL THIN FILM TRANSISTORS

[75] Inventors: Joerg Baumbach, New Providence; Ananth Dodabalapur, Millington; Howard E. Katz, Summit, all of N.J.

[73] Assignee: Lucent Technologies Inc., Murray Hill, N.J.

[21] Appl. No.: 587,426

[22] Filed: Jan. 16, 1996

[51] Int. Cl.$^6$ .................................... H01L 35/24
[52] U.S. Cl. .................. 257/40; 257/57; 257/59; 257/69; 257/351
[58] Field of Search ................ 257/57, 59, 61, 257/69, 350, 351, 369, 40

[56] References Cited

U.S. PATENT DOCUMENTS

| | | | |
|---|---|---|---|
| 5,347,144 | 9/1994 | Garnier et al. | 257/40 |
| 5,442,198 | 8/1995 | Arai et al. | 257/72 |

OTHER PUBLICATIONS

"Logic Gates Made from Polymer Transistors and Their Use in Ring Oscillators", by A. R. Brown et al., *Science*, vol. 270, p. 972, Nov. 1995.

"Organic Transistors: Two–Dimensional Transport and Improved Electrical Characteristics", by A. Dodabalapur et al., *Science*, vol. 268, p. 270, 14 Apr. 1995.

"Synthesis and Superior Transistor Performance of Dopant–Free Thiophene Hexamers", by H. E. Katz et al., *Proceedings of the PMSE Division of the American Chemical Society*, vol. 72, p. 467 (1995).

"Organic Heterostructure Field–Effect Transistors", by A. Dodabalapur et al., *Science*, vol. 269, p. 1560, Sep. 1995.

Horowitz et al., "Thin Film Transistors Based on Alpha-–Conjugated Oligomers", Synthetic Metals, 41–43, 1991.

*Primary Examiner*—Minhloan Tran
*Attorney, Agent, or Firm*—Eugen E. Pacher

[57] ABSTRACT

Complementary circuits with inorganic n-channel thin film transistors (TFTs) and organic p-channel TFTs can exhibit advantageous properties, without being subject to some of the drawbacks of prior art complimentary inorganic TFTs or complementary organic TFTs. In preferred embodiments of the invention, the n-channel inorganic TFTs have an amorphous Si active layer, and the p-channel organic TFTs have Δ-hexathienylene ($\alpha$-6T) active layer. Complementary inverters according to the invention are disclosed, as is an exemplary processing sequence that can be used to manufacture integrated complementary inverters and other complementary circuits according to the invention.

7 Claims, 4 Drawing Sheets

ARTICLE COMPRISING COMPLEMENTARY CIRCUIT WITH INORGANIC N-CHANNEL AND ORGANIC P-CHANNEL THIN FILM TRANSISTORS

FIELD OF THE INVENTION

This invention pertains to articles at comprise complementary, thin film transistors, in particular, to articles at comprise organic thin film transistors (organic TFTs).

BACKGROUND OF THE INVENTION

Organic TFTs are known. See, for instance, U.S. Pat. No. 5,347,144. However, until recently, attainable device parameters (e.g., on/of F ratio) were insufficient for most contemplated applications (e.g., as pixel switches in active matrix liquid crystal displays). A. R. Brown (*Science*, Vol. 270, p. 972, November 1995) disclose logic gates made from polymer transistors.

Recently it has been demonstrated that organic TFTs (more specifically, organic TF field effect transistors or TF-FETs) can be produced to have on/off current ratios >$10^6$ and switching speeds of about 10 µs. See A. Dodabalapur et al., *Science*, Vol. 268, p. 270 (1995), and H. E. Katz et al., *Proceeding of the PMSE Division of the American Chemical Society*, Vol. 72, p. 467 (1995). See also U.S. patent applications Ser. Nos. 08/353,024, and 08/353,032, both filed Dec. 9, 1994 by A. Dodabalapur et al. and co-assigned with this. The relevant disclosures of the cited publications and patent applications are incorporated herein by reference.

More recently still it was discovered that organic TF FETs can be designed such that a given device can function as a n-channel or p-channel device, depending on biasing conditions. See U.S. patent application Ser. No. 08/446,142, filed May 15, 1995 by A. Dodabalapur et al., co-assigned with this and incorporated herein by reference. See also A. Dodabalapur et al., *Science*, Vol. 269, p. 1560 (September 1995), also incorporated by reference.

As those skilled in the art will recognize, the organic TF FETs of the '142 patent application can be combined to yield complementary circuits, with the attendant advantages of reduced power consumption and simplicity of circuit design.

The devices of the '142 patent comprise an organic p-channel material (exemplarily α-hexathienylene or α-6T) and an organic n-channel material (exemplarily $C_{60}$). Whereas α-6T can be a relatively stable material that is more easily deposited in p-type form than many inorganic semiconductors, $C_{60}$ and other organic materials that have been made to work as n-channel material typically undergo degradation when used in air. Thus such devices typically require unconventional manufacturing techniques and/or careful packaging in order to attain reasonable lifetimes. Such manufacturing and packaging would at best be expensive (and thus incompatible with many of the low cost applications envisaged for complementary organic TF FETs). The required hermetic packaging may even be incompatible with such contemplated applications as smart cards and RF identification tags, which frequently demand at least a modest degree of mechanical flexibility of the circuitry.

At least until the above referred-to technological difficulties with organic n-channel TF FETs are overcome, it would be of interest to have available a technology for making complementary circuits that is capable of taking advantage of the excellent characteristics of known p-channel organic TF FETs and of n-channel inorganic TF FETs, e.g., amorphous Si TF FETs, without being subject to the problems currently typically associated with organic n-channel TF FETs and inorganic p-channel TF FETs. This application discloses such a technology.

SUMMARY OF THE INVENTION

In a broad aspect the invention is embodied in an article (e.g., a smart card, a RF identification tag, an active matrix liquid crystal display, a random access memory, a read-only memory) that comprises at least a first and a second transistor, the two transistors being operatively connected together. The first transistor is a n-channel transistor and the second transistor is a p-channel transistor. The article thus comprises a circuit with complementary transistors, typically a multiplicity of n-channel transistors and a multiplicity of p-channel transistors. The transistors typically are operatively interconnected by conventional means, and the article typically comprises means that facilitate provision of electrical power (including an electrical signal) to the transistors.

Significantly, the n-channel transistor is an inorganic thin film transistor, exemplarily comprising material selected from the group consisting of amorphous silicon (a-Si), polycrystalline silicon, CdSe, $TiO_2$, ZnO and $Cu_2S$ and the p-channel transistor is an organic TFT.

The active layer of the p-channel organic TFT exemplarily comprises a member of the group consisting of i) oligomers of thiophene with degree of oligomerization $\geq 4$ and $\leq 8$, linked via their 2- and 5-carbons;

ii) alternating co-oligomers of thienylene and vinylene with thiophenes as terminal groups and 3–6 thiophene rings, linked via their 2- and 5-carbons;

iii) linear dimers and trimers of benzo [1, 2-b: 4, 5-b'] dithiophene;

iv) the above oligomers with substituents (e.g., alkyl substituents with 1–20 carbons) on the 4- or 5-carbons of the end thiophenes;

v) tetracene, pentacene, and end-substituted derivatives thereof; and vi) composites of p, p'-(diaminobiphenyl in polymer matrices.

Articles according to the invention thus comprise hybrid complementary TFTs, and thus combine advantageous features of the two involved technologies, namely, inorganic TFT and organic TFTs technologies. In currently preferred embodiment the active layer of the p-channel (organic) TFT is α-6T, and of the channel (inorganic) TFT is amorphous silicon (a-Si).

BRIEF DESCRIPTION OF THE DRAWINGS

Like reference numerals refer to like or analogous features in the figures.

DETAILED DESCRIPTION OF EXEMPLARY PREFERRED EMBODIMENTS

We have discovered that a hybrid thin film technology that combines p-channel organic TFTs and n-channel inorganic TFTs can offer advantageous features (e.g., relatively good stability in air, reasonably high carrier mobility) while avoiding some of the shortcomings of the prior art technologies (e.g., relative instability of the organic n-channel material, low n-channel mobility). For the sake of definiteness, the discussion below will be in terms of preferred embodiments of the invention, namely, articles that comprise an a-Si (n-channel) TFT and an α-6T (p-channel) TFT.

Figure 1:
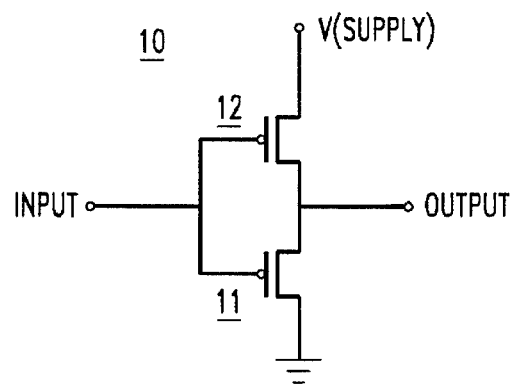
FIG. 1 schematically shows an exemplary complementary circuit, namely, an inverter.

The inventive approach was exemplarily demonstrated with a complementary inverter circuit (10) as shown in FIG. 1. The n-channel a-Si TFT (11) was fabricated on a glass substrate. The channel dimensions of the n-channel TFT exemplarily are about 8 and 9 μm (width and length, respectively). Finished devices were packaged in a TO-8 header using conventional techniques. The p-channel α-6T TFT (12) was made on a thermally oxidized n-type Si wafer. The Si functions as the gate contact and the $SiO_2$ as the gate dielectric. Gold source and drain pads were photolithographically defined on top of the $SiO_2$. The channel length and width of the exemplary p-channel TFT was 25 μm and 250 μm, respectively. α-6T was sublimed over the described structure at a pressure of $10^{-6}$ Torr to complete the organic TFT. Electrical contact to the source and drain were made through the thin (e.g., 50 nm) α-6T layer.

Figure 2:
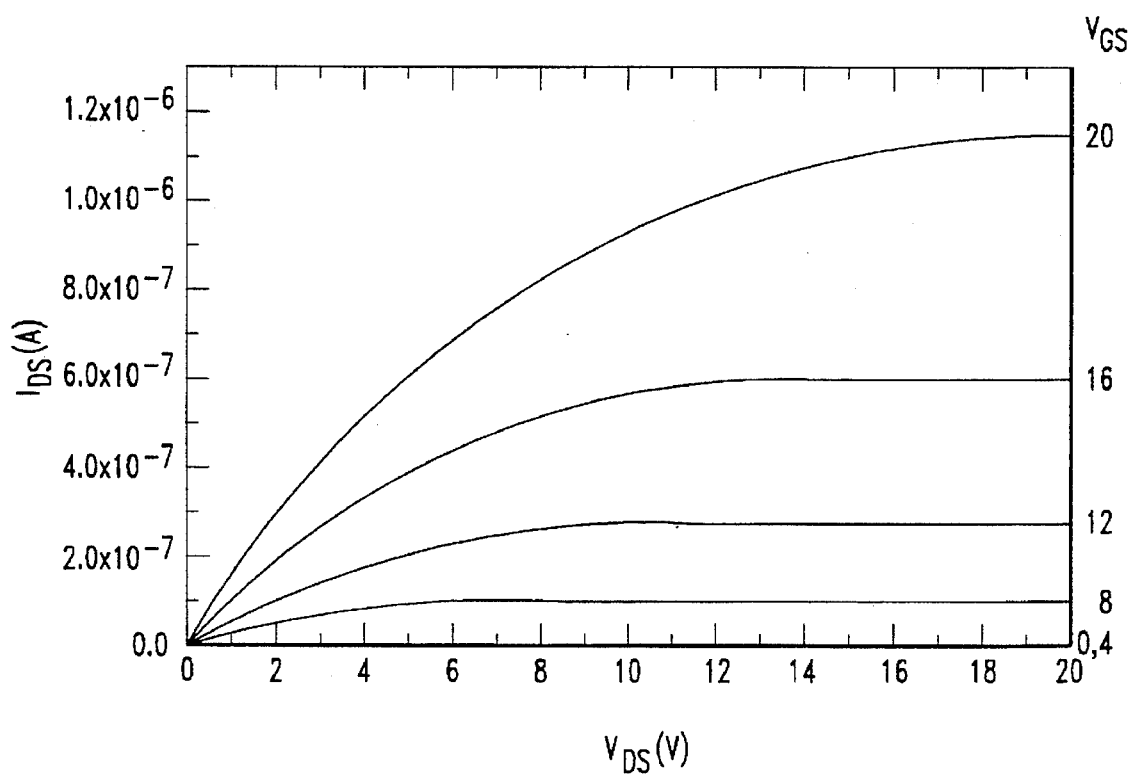
FIGS. 2 and 3 show the respective current-voltage characteristics of an exemplary n-channel a-Si TFT and an exemplary p-channel α-6T TFT.
Figure 3:
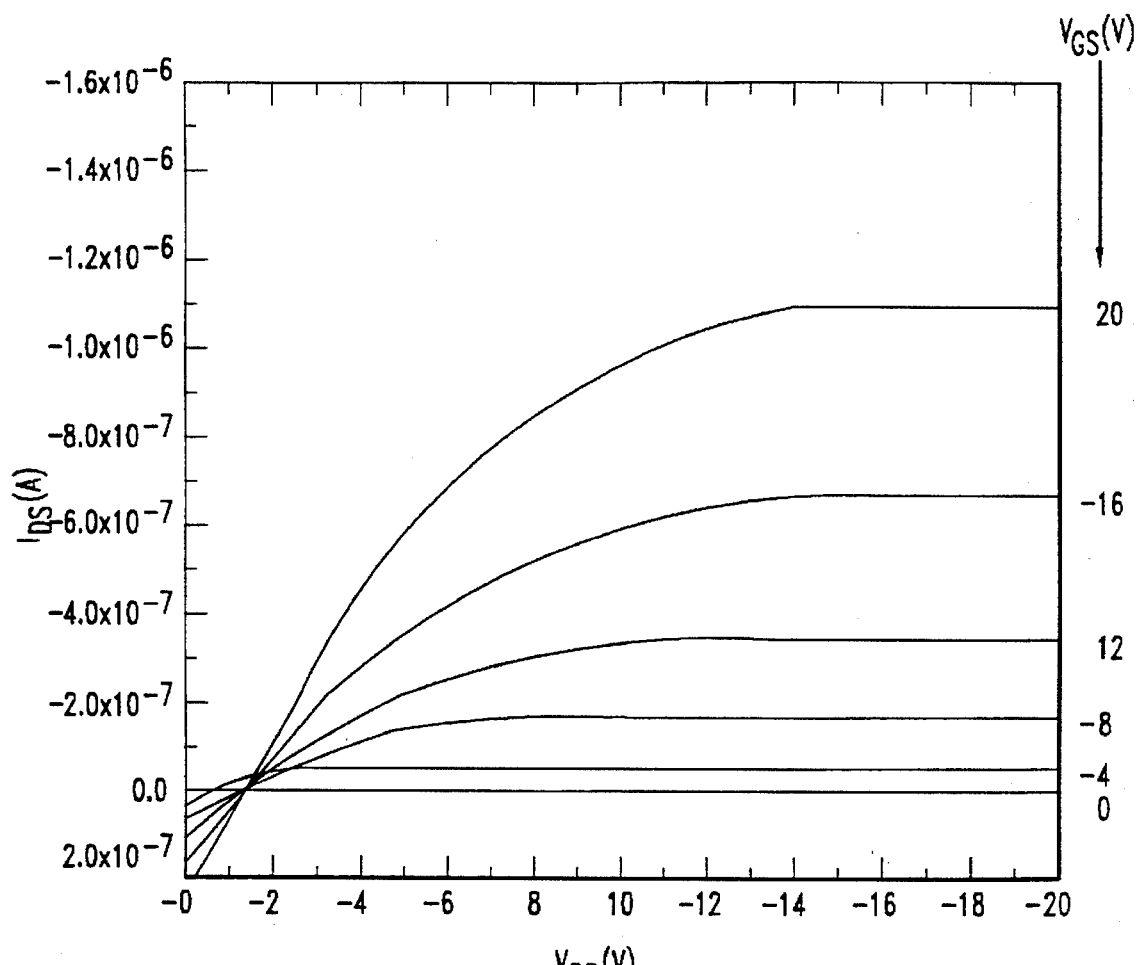

FIGS. 2 and 3 show the current-voltage characteristics of the n-channel and p-channel TFTs, respectively, with $I_{DS}$, $V_{DS}$ and $V_{GS}$ signifying, respectively, drain-source current, drain-source voltage, and gate-source voltage. The exemplary a-Si TFT has a field-effect mobility in the range 0.1–1 $cm^2/V \cdot s$, and the exemplary α-6T TFT has a field-effect mobility in the range 0.01–0.03 $cm^2/V \cdot s$. The threshold voltages of the exemplary a-Si and α-6T TFTs are ~4 V and 200 meV, respectively. The channel dimensions of the n- and p- channel transistors were chosen so that the drain currents are approximately equal for similar absolute values of the drain-source voltage and gate voltage. However, channel dimensions of the devices can be scaled down to levels limited by the lithographic or patterning techniques employed. Using previously disclosed synthesis and purification techniques, α-6T TFTs with channel lengths as small as 1.5 μm have been fabricated which possess current-voltage characteristics similar to that shown in FIG. 3.

Figure 4:
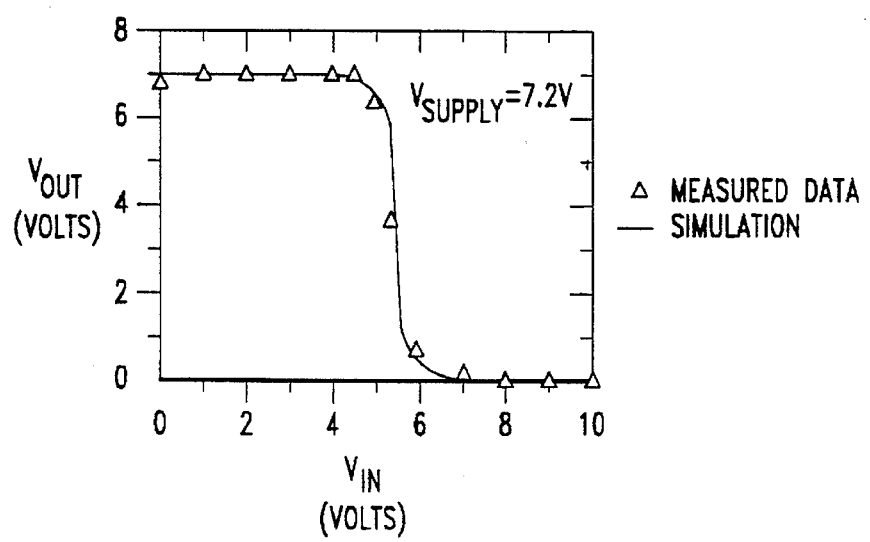
FIG. 4 shows the transfer characteristic of an exemplary inverter for a supply voltage of 7.2 V.

Complementary inverters were made by interconnecting the above described devices as shown in FIG. 1, where the p-channel α-6T TFT functions as the load transistor. The resulting inverters were tested under a variety of bias conditions. The supply voltage was varied in the range 5–18 V, and the transfer characteristics measured. FIG. 4 shows exemplary transfer characteristics for a supply voltage of 7.2 V.

For low values of input voltage $V_{in}$, the p-channel α-6T load transistor is on (since the gate-source voltage is negative), and the n-channel is off. The output voltage $V_{out}$ substantially equals the supply voltage. As $V_{in}$ is increased the n-channel a-Si transistor is gradually turned on. A further increase in $V_{in}$ causes the p-channel device to be turned off and the n-channel device to be turned completely on. Similar behavior was achieved with the supply voltage as low as 5 V. The inverter circuit was simulated using the software tool MICROCAP®. The device characteristics of the n- and p-channel transistors were input into the program and transfer characteristics simulated. The results of the simulation are shown in FIG. 4 along with the experimental data points. Excellent agreement is obtained between theory and experiment for $V_T$=3.7 V, which is very close to the measured threshold voltage of the device. The simulation also indicates that lowering this threshold voltage will allow the inverter to operate with a lower supply voltage.

A significant feature of complementary circuits according to the invention is their manufacturability in integrated circuit form, i.e., with both n-channel and p-channel TFTs disposed on a common substrate. An exemplary manufacturing process will be described below. The process could be used, for instance, to produce integrated inverter circuits of the type shown in FIG. 1. Since the inverter is the simplest complementary circuit, availability of a process for manufacture of an integrated inverter circuit implies that more complex circuits can also be realized with a given technology.

Among the significant process steps are the following:

1) provision of an appropriate substrate (e.g., a glass or plastic body);

2) gate metal (e.g., Ta, Cr, Al) deposition and patterning. This gate is common to both n- and p-channel transistors;

3) gate dielectric (e.g., polyimide or other polymer that can be deposited by spinning or spraying from a liquid base) deposition. The polymer typically is cured after deposition. For instance, we have successfully used a pre-imidized polyimide supplied by Nissan Chemical Company under the designation SE-1180. The dielectric was spun at 4000 RPM and cured at 120° C. for 2 hours. The thickness of a single coating was about 70 nm. In some instances two coatings were used;

4) undoped a-Si deposition (typically by plasma-enhanced CVD or RF sputtering) and patterning. This material will form the active layer of the n-channel transistor. It is removed by etching from most areas except the n-channel regions;

5) deposition of an isolation layer (e.g., SiN, polyimide or other insulator). This layer serves to prevent electrical shorting between source and drain regions of the n-channel transistors; For example, a polyimide manufactured by Nissan Chemical Company (designated RN-812) can be used. It forms an about 1 μm thick film and has good insulation properties;

6) patterning of the isolation layer. Windows are defined at the regions which will become the source and drain of the n-channel device, and material is removed in the region away from the active n-channel device area;

7) deposition of $n^+$ a-Si (e.g., by plasma CVD or sputtering). This material will serve to facilitate making electrical contact to the undoped a-Si active layer;

8) patterning of the $n^+$ a-Si layer (by opening a window to the isolation layer in the gate region) so as not to short the source and drain regions.

9) deposition and patterning of source/drain contact metal (e.g., Al). The metal is patterned such that source and drain of the n-channel device are not shorted together. It is also patterned to connect the n-channel and p-channel transistors in the circuit. Consequently it extends to some extent towards the (as yet not defined) p-channel device, and will form the source contact of the p-channel device;

10) deposition of SiN, polyimide or other dielectric to isolate the source/drain metal from the organic active layer that will be deposited in the next step. Patterning to remove polyimide above the active region of the p-channel transistor;

11) deposition (e.g., by vacuum sublimation) of organic active material (e.g, α-6T);

12) deposition (e.g., by sputtering or vacuum evaporation) and patterning of the drain contact metal (e.g., Au, Ag) of the p-channel transistor. This metal layer is also connected to the positive supply voltage;

13) deposition of a final passivation layer (e.g., SiN, polyimide) to protect the circuit and the devices.

Figure 5:
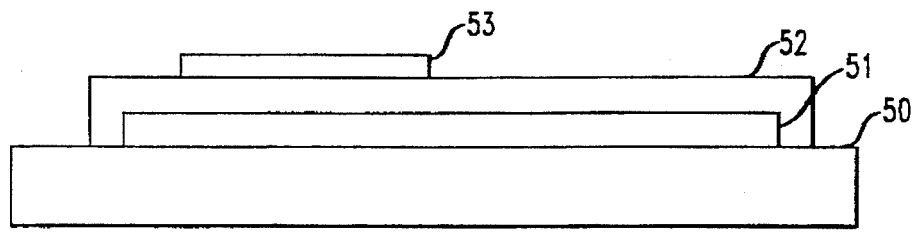
FIGS. 5–9 schematically illustrate significant steps in an exemplary process for making an integrated complementary circuit according to the invention.
Figure 6:
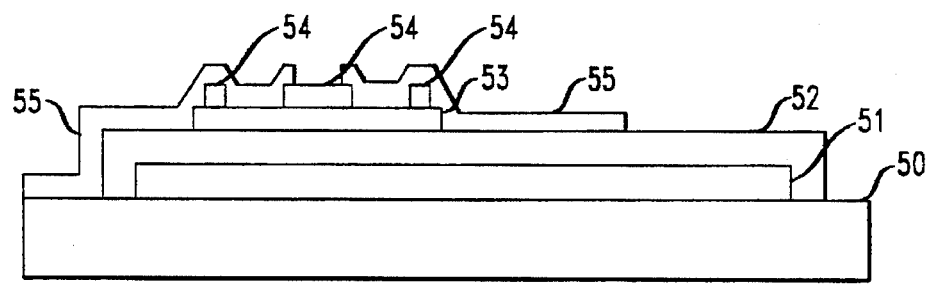
Figure 7:
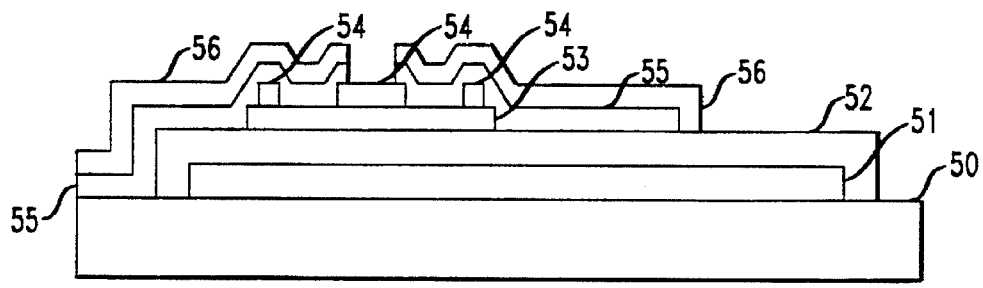
Figure 8:
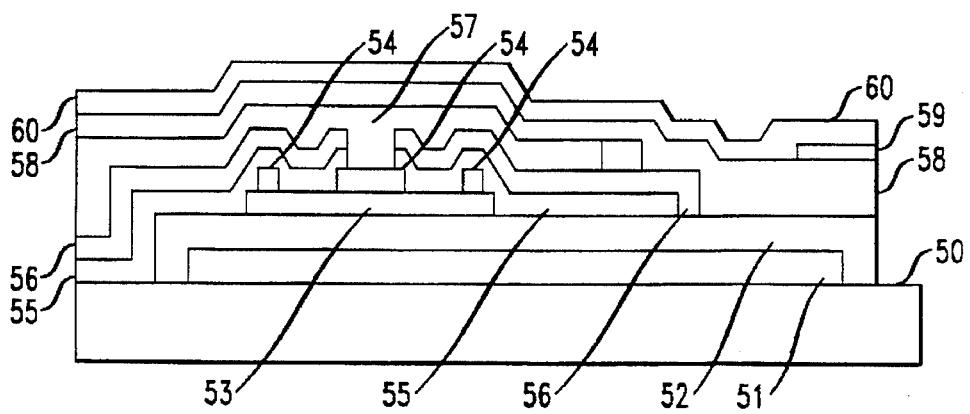
Figure 9:
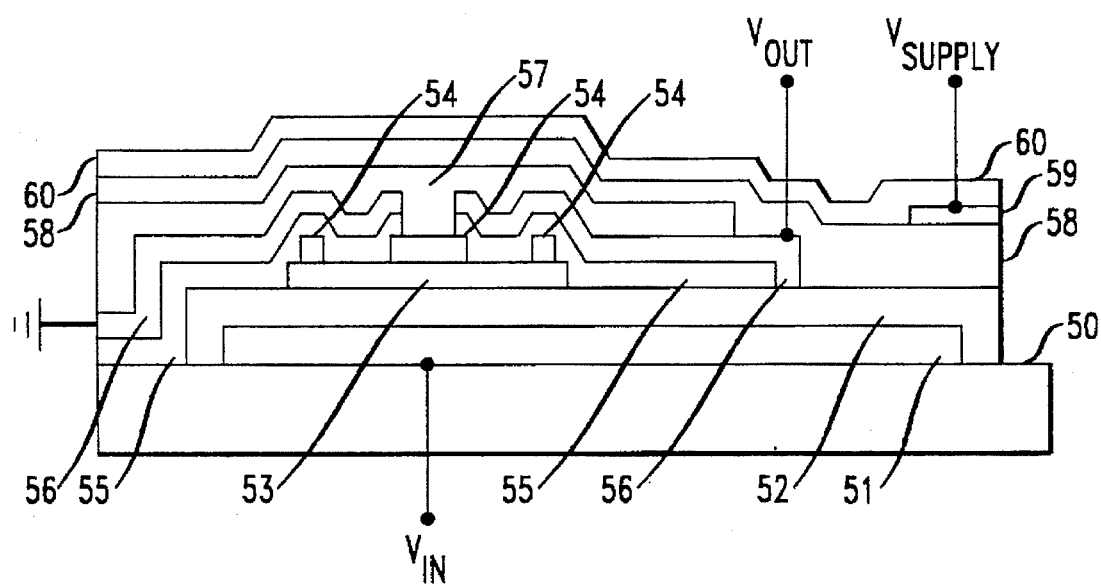

FIGS. 5–9 schematically illustrate the above fabrication process. In FIG. 5, numerals 50–53 designate, respectively, the substrate, common gate metal, gate dielectric, and patterned undoped a-Si. In FIG. 6, numerals 54 refer to the patterned isolation layer, and 55 refers to the patterned n⁺ a-Si layer. In FIG. 7, numerals 56 refer to the patterned source/drain metal layer. In FIG. 8, numeral 57 refers to the patterned isolation layer, 58 refers to the organic active layer (e.g., α-6T), 59 refers to the drain contact of the p-channel transistor, and 60 refers to the final passivation layer. Finally, FIG. 9 schematically shows the layer structure of an inverter according to the invention, with the various voltages (V supply, ground, $V_{in}$ and and $V_{out}$) indicated.

In an exempllary embodiment, the substrate (50) is KAPTON®, gate metal layer (51) is 50 nm of Ta, gate dielectric layer (52) is about 70 nm of the above referred-to polyimide, and patterned active n-channel material (53) is 100 nm of undoped amorphous Si (deposited by plasma enhanced CVD, substrate at 250° C.; patterned by plasma etching). A 1 μm thick polyimide isolation layer is deposited (using the above referenced RN-812) and patterned (54) by etching in an oxygen plasma (300 m Torr, room temperature). A 50 nm layer of n⁺ a-Si (55) is deposited by plasma enhanced CVD and patterned. Source/drain contact (56) (50 nm Al) is deposited and patterned. This metal also serves to connect the n-channel and p-channel transistors in the circuit, and for this reason extends somewhat towards the p-channel transistor and forms the source contact of the p-channel transistor. A 1 μm layer (57) of the above referred-to polyimide is spun on and etched away from regions near the p-channel transistor. A 50 nm layer (58) of α-6T is deposited by sublimation without masking or patterning. The drain contact (59) of the p-channel transistor (50 nm Al) is deposited by sputtering and patterned. A final polyimide passivation layer (60) is spun on.

The invention claimed is:

1. An article comprising a first and a second transistor, said first and second transistors being operatively connected together, the first transistor being a n-channel transistor and the second transistor being a p-channel transistor;

CHARACTERIZED IN THAT the n-channel transistor is an inorganic thin film transistor and the p-channel transistor is an organic thin film transistor.

2. Article according to claim 1, wherein the inorganic thin film transistor comprises an active layer comprising material selected from the group consisting of amorphous Si, polycrystalline Si, CdSe, $TiO_2$, ZnO and $Cu_2S$, and wherein the organic thin film transistor comprises an active layer comprising material selected from the group consisting of i) oligomers of thiophene with degree of oligomerization ≧4 and ≦8, linked via their 2- and 5-carbons;

ii) alternating co-oligomers of thienylene and vinylene, with thiophenes as terminal groups and 3–6 thiophene rings, linked via their 2- and 5-carbons;

iii) linear dimers and trimers of benzo [1, 2-b: 4, 5-b'] dithiophene;

iv) any of the oligomers of i), ii) and iii) with substituents on the 4- or 5-carbons of the end thiophenes;

v) tetracene, pentacene, and end-substituted derivatives thereof; and vi) composites of p, p'-diaminobiphenyls in polymer matrices.

3. Article according to claim 2, wherein said substituents on the 4- or 5-carbons of the end thiophene are alkyl substituents with 1–20 carbons.

4. Article according to claim 1, wherein said first and second transistors are operatively connected to form a complimentary inverter circuit.

5. Article according to claim 1, wherein the inorganic thin film transistor comprises an active layer that comprises amorphous silicon.

6. Article according to claim 1, wherein the organic thin film transistor comprises an active layer that comprises α-hexathienylene.

7. Article according to claim 6, wherein the inorganic thin film transistor comprises an active layer that comprises amorphous silicon.

* * * * *

UNITED STATES PATENT AND TRADEMARK OFFICE
CERTIFICATE OF CORRECTION

PATENT NO. : 5,625,199
DATED : April 29, 1997
INVENTOR(S) : Joerg Baumbach, Ananth Dodabalapur and Howard E. Katz It is certified that error appears in the above-indentified patent and that said Letters Patent is hereby corrected as shown below:

Column 1, line 34, "08/446,142" should read --08/441,142--.

Signed and Sealed this

Twenty-fourth Day of June, 1997

Attest:

BRUCE LEHMAN

*Attesting Officer*  *Commissioner of Patents and Trademarks*